United States Patent
Kitano et al.

(10) Patent No.: US 11,452,973 B2
(45) Date of Patent: Sep. 27, 2022

(54) REVERSE OSMOSIS MEMBRANE AND METHOD FOR PRODUCING REVERSE OSMOSIS MEMBRANE

(71) Applicants: KITAGAWA INDUSTRIES CO., LTD., Aichi (JP); SHINSHU UNIVERSITY, Nagano (JP)

(72) Inventors: Hiroki Kitano, Kasugai (JP); Akio Yamaguchi, Kasugai (JP); Morinobu Endo, Nagano (JP); Josue Ortiz Medina, Nagano (JP)

(73) Assignees: KITAGAWA INDUSTRIES CO., LTD., Aichi (JP); SHINSHU UNIVERSITY, Nagano (JP)

( * ) Notice: Subject to any disclaimer, the term of this patent is extended or adjusted under 35 U.S.C. 154(b) by 197 days.

(21) Appl. No.: 16/771,091

(22) PCT Filed: Jan. 24, 2019

(86) PCT No.: PCT/JP2019/002195
§ 371 (c)(1),
(2) Date: Jun. 9, 2020

(87) PCT Pub. No.: WO2019/146671
PCT Pub. Date: Aug. 1, 2019

(65) Prior Publication Data
US 2021/0187445 A1 Jun. 24, 2021

(30) Foreign Application Priority Data
Jan. 24, 2018 (JP) .............................. JP2018-009722

(51) Int. Cl.
*B01D 71/02* (2006.01)
*C01B 32/05* (2017.01)
(Continued)

(52) U.S. Cl.
CPC ......... *B01D 71/021* (2013.01); *B01D 61/025* (2013.01); *B01D 67/0072* (2013.01);
(Continued)

(58) Field of Classification Search
CPC ................ B01D 71/021; B01D 61/025; B01D 67/0072; B01D 67/0074; B01D 69/10;
(Continued)

(56) References Cited

U.S. PATENT DOCUMENTS

| | | | |
|---|---|---|---|
| 2010/0012576 A1 | 1/2010 | Hoffman et al. | |
| 2014/0097146 A1 | 4/2014 | Shah et al. | |

(Continued)

FOREIGN PATENT DOCUMENTS

| | | |
|---|---|---|
| JP | 2009-536916 | 10/2009 |
| JP | 2015-535743 | 12/2015 |

(Continued)

OTHER PUBLICATIONS

Ortiz-Medina et al. "Nanostructured carbon-based membranes: nitrogen doping effects on reverse osmosis performance" NPG Asia Materials, 2016, vol. 8, e258, pp. 1-10, XP55562102.
(Continued)

*Primary Examiner* — Krishnan S Menon
(74) *Attorney, Agent, or Firm* — Wenderoth, Lind & Ponack, L.L.P.

(57) ABSTRACT

A reverse osmosis membrane of the present invention includes a porous support substrate (2) and a separation active layer (3) formed on a surface of the porous support substrate (2) and formed of a carbon film containing organized carbon.

6 Claims, 5 Drawing Sheets

(51) Int. Cl.
*B01D 61/02* (2006.01)
*B01D 67/00* (2006.01)
*B01D 69/10* (2006.01)
*C02F 1/44* (2006.01)
*C02F 101/12* (2006.01)
*C02F 103/08* (2006.01)
*C23C 14/06* (2006.01)

(52) U.S. Cl.
CPC ......... *B01D 67/0074* (2013.01); *B01D 69/10* (2013.01); *C01B 32/05* (2017.08); *C02F 1/441* (2013.01); *C01P 2004/04* (2013.01); *C02F 2101/12* (2013.01); *C02F 2103/08* (2013.01); *C23C 14/0605* (2013.01)

(58) Field of Classification Search
CPC ............ B01D 2323/10; B01D 67/0086; B01D 69/12; B01D 61/145; C01B 32/05; C01B 32/15; C02F 1/441; C02F 2101/12; C02F 2103/08; C01P 2004/04; C23C 14/0605; C23C 14/0005; C23C 14/024; C23C 14/06
See application file for complete search history.

(56) References Cited

U.S. PATENT DOCUMENTS

2017/0001153 A1* 1/2017 Ichinose ................ B01D 69/10
2018/0193799 A1* 7/2018 Kitano ................ B01D 71/021
2020/0261858 A1* 8/2020 Seo ....................... C01B 32/186

FOREIGN PATENT DOCUMENTS

JP   2017-064692   4/2017
WO   2015/080259   6/2015

OTHER PUBLICATIONS

International Search Report dated Apr. 9, 2019 in International (PCT) Application No. PCT/JP2019/002195.

* cited by examiner

REVERSE OSMOSIS MEMBRANE AND METHOD FOR PRODUCING REVERSE OSMOSIS MEMBRANE

TECHNICAL FIELD

The present invention relates to a reverse osmosis membrane and a method for producing the reverse osmosis membrane.

BACKGROUND ART

Use of a carbon film has been attempted as a separation active layer in a reverse osmosis membrane (RO membrane). For example, Patent Document 1 describes a reverse osmosis membrane using a hard carbon film (diamond-like carbon film) as a separation active layer.

Patent Document 2 describes a reverse osmosis membrane in which a carbon film with an amorphous carbon structure containing a nitrogen atom is used as a separation active layer.

CITATION LIST

Patent Document

Patent Document 1: WO 2015/080259
Patent Document 2: JP 2017-64692 A

Technical Problem

The hard carbon film of Patent Document 1 has a maximum diameter of a pore of less than 0.86 nm, and is referred to as a reverse osmosis membrane; however, in reality, it can be said to be a kind of filtration membrane that has a constant pore penetrating the hard carbon film, and performs screening by the size of the substance corresponding to the pore diameter. Therefore, in the reverse osmosis membrane of Patent Document 1, a blocking ratio of sodium chloride in an aqueous sodium chloride solution (concentration: 0.01 M) remained approximately 80%.

The carbon film of Patent Document 2 is a filtration membrane that uses the principle of diffusion, and is assumed to have a small hole that continually changes in shape, rather than a constant through-hole. Therefore, in the reverse osmosis membrane of Patent Document 2, the blocking ratio of sodium chloride (desalination ratio) in an aqueous sodium chloride solution (concentration: 0.2% by mass) was recorded up to 96.8%. However, the carbon film of Patent Document 2 has room for improvement in durability, and further improvement in the blocking ratio (desalination ratio) has also been demanded.

SUMMARY OF INVENTION

An object of the present invention is to provide a reverse osmosis membrane in which a carbon film having excellent desalination performance (separation performance) or the like is used as a separation active layer.

Solution to Problem

The solutions to the above problems are as follows. That is,

<1> A reverse osmosis membrane including: a porous support substrate; and a separation active layer formed on a surface of the porous support substrate and formed of a carbon film containing organized carbon.

<2> The reverse osmosis membrane according to the above <1>, wherein a desalination ratio is 99% or higher when an aqueous NaCl solution (concentration: 3.2% by mass) is desalted at a filtration pressure of 5.5 MPa or greater.

<3> The reverse osmosis membrane according to the above <1> or <2>, wherein the porous support substrate includes a nonwoven backing layer and a porous plastic layer formed on the backing layer.

<4> A method for producing a reverse osmosis membrane, the method including: a coating film forming step of forming a coating film soluble in a predetermined solvent on a surface of a porous support substrate insoluble in the solvent; a pre-carbon film forming step of forming a pre-carbon film on the coating film by a physical vapor deposition method using carbon as a target material; a coating film removal step of dissolving and removing the coating film with the solvent after the carbon film is formed; and an organization step of compressing the pre-carbon film to form a separation active layer formed of a carbon film containing organized carbon.

Advantageous Effects of Invention

According to the invention of the present application, it is possible to provide a reverse osmosis membrane in which a carbon film having excellent desalination performance (separation performance) or the like is used as a separation active layer.

DESCRIPTION OF EMBODIMENTS

Reverse Osmosis Membrane

Figure 1:
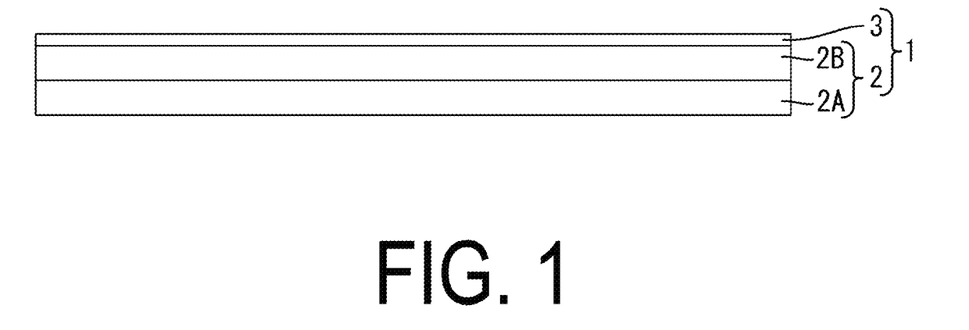
FIG. 1 is an explanatory view schematically illustrating a cross-sectional configuration of a reverse osmosis membrane.

FIG. 1 is an explanatory view schematically illustrating a cross-sectional configuration of a reverse osmosis membrane 1. The reverse osmosis membrane 1 includes a porous substrate 2 and a separation active layer 3 formed on a surface of the porous support substrate 2 and formed of a carbon film containing organized carbon.

The reverse osmosis membrane 1 can separate a certain substance contained in a solution to be filtered from the solution by filtering the solution. For example, in a case where the solution to be filtered is brine, the reverse osmosis membrane 1 can remove salt (NaCl) while removing pure water from the brine by filtering the brine (aqueous sodium chloride solution). It is assumed that this is because the water molecules in the brine are taken in a carbon film which is the separation active layer 3 in a dissolved manner, and diffusely move in the carbon film. It is also assumed that sodium ions and chloride ions in the brine are in a cluster state with at least a few water molecules, and entry into the carbon film is prevented.

Porous Support Substrate

The porous support substrate 2 is a porous member for supporting the separation active layer 3 and is formed into a sheet shape. A so-called nanofiltration membrane (NF membrane) or an ultrafiltration membrane (UF membrane) can be used as the porous support substrate 2. As long as the object of the present invention is not impaired, a pure water permeability coefficient Lp of the porous support substrate 2 is not particularly limited, and is, for example, 200 L/($m^2$·h·MPa) to 3500 L/($m^2$·h·MPa).

For example, a two-layer structure formed of a nonwoven backing layer 2A and a porous plastic layer 2B formed on a surface of the backing layer 2A is used as the porous support substrate 2.

The backing layer 2A is made of resin fibers formed into a non-woven fabric and is formed into a sheet shape (layer shape). The resin used in the backing layer 2A is selected to be insoluble in an immersion liquid (solvent) described below. Examples of the resin used in the backing layer 2A include polyester resins such as polyethylene terephthalate (PET) and polybutylene terephthalate (PBT), and polyolefin resins such as ethylene and propylene. Such a backing layer 2A is formed of a non-woven fabric, and therefore has liquid permeability.

The porous plastic layer 2B is formed of a porous plastic layer (sheet) laminated on the surface of the backing layer 2A. The porous plastic layer 2B includes a plurality of pores of approximately from 0.001 μm to 10 μm, which penetrates in a thickness direction.

As the plastic material (resin material) forming the porous plastic layer 2B, a material that is insoluble in the immersion liquid (solvent) described below and retains the shape even in a state in which the pores are formed. Examples of the plastic material (resin material) used in the porous plastic layer 2B include polysulfone (PSF) and polyacrylonitrile (PAN). The method of forming pores in the porous plastic layer 2B is not particularly limited, and the porous plastic layer 2B is formed as appropriate by a known method.

The thickness of the porous support substrate 2 is not particularly limited as long as the object of the present invention is not impaired. The thickness is set as appropriate in accordance with the purpose, and is set to be, for example, within a range from 20 μm to 100 μm.

Examples of the commercially available porous support substrate include a UF membrane (product name "GR40PP", available from Alfa Laval AB) and a UF membrane (product name "MW2450F30", available from General Electric Company).

The porous support substrate 2 may be laminated with other layers as long as the object of the present invention is not impaired. Note that, as long as the object of the present invention is not impaired, the porous support substrate 2 may have a shape other than a sheet shape.

Separation Active Layer

The separation active layer 3 is formed of a carbon film containing organized carbon and has a function of separating a certain substance contained in the solution from the solution. The separation active layer 3 does not have pores having the size as seen in the porous plastic layer 2B of the porous support substrate 2. It is assumed that the separation active layer 3 has a hole that continually changes in shape, rather than a constant through-hole.

The separation active layer 3 is formed on the surface of the porous support substrate 2 that is at least in contact with the solution to be filtered. In the case of the present embodiment, the separation active layer 3 is formed on one of the substrate surfaces of the porous support substrate 2 having a sheet shape.

The separation active layer 3 is formed of a carbon film containing partially organized carbon. In the present specification, "organized carbon" means a membrane structure in which a specific significant periodic distance is formed between carbon atoms in amorphous carbon (diamond-like carbon) having no specific structural periodicity. The organization of carbon is a different concept from crystallization, and the presence thereof is inferred from the analysis results of the carbon film by TEM described below. It is sufficient that at least a portion of carbon is organized in the separation active layer (carbon film) 3, and the entire carbon of the carbon film 3 need not be organized.

In the separation active layer 3, other atoms such as nitrogen atoms may be contained in the carbon (other than carbon atoms).

The separation active layer 3 is formed, for example, by compressing an amorphous pre-carbon film at a high pressure in an organization step described below. Note that, a method of forming the separation active layer 3 (the carbon film containing the organized carbon) is not particularly limited as long as the object of the present invention is not impaired, and for example, the separation active layer 3 (the carbon film containing the organized carbon) may be formed via steps other than the organization step described below. For example, a separation active layer in another embodiment may be organized by heating the pre-carbon film and an organized separation active layer may be formed by utilizing a membrane forming pressure.

The thickness of the separation active layer 3 is set to, for example, within a range from 5 nm to 100 nm, as long as the object of the present invention is not impaired.

Method for Producing Reverse Osmosis Membrane

The method for producing a reverse osmosis membrane according to the present embodiment includes a coating film forming step, a pre-carbon film forming step, a coating film removal step, and an organization step.

Coating Film Forming Step

The coating film forming step is a step of forming a coating film that is soluble in a predetermined solvent on the surface of the porous support substrate 2 that is unnecessary to the solvent.

The coating film is formed on the surface of the porous support substrate 2 in advance before forming the separation active layer 3. The coating film is formed to cover the surface of the porous plastic layer 2B while closing pores provided in the porous plastic layer 2B of the porous support substrate 2.

The coating film is not particularly limited as long as the coating film can be removed with a predetermined solvent in the coating film removal step described below, and the coating film is selected as appropriate from known resin materials and known solvents, depending on the purpose. Examples of such a coating film include a polyvinylpyrrolidone (PVP) solution in which PVP powder is dissolved in a mixed solvent of water and ethanol.

The method of forming the coating film on the surface of the porous support substrate 2 (the surface of the porous plastic layer 2B) is not particularly limited, and a known coating method is applied. For example, there is exemplified a method of immersing the porous support substrate in a predetermined container containing a coating solution to form a coating film for a predetermined time and then raising the porous support substrate from the coating solution to form a coating film on the surface of the porous support substrate. In addition, the coating film on the porous support substrate 2 is dried as appropriate.

Note that, the thickness of the coating film is not particularly limited as long as the object of the present invention is not impaired, and for example, a coating solution for forming a coating film is applied to the surface (per unit area) of the porous support substrate in the range of from 1 mg/cm$^2$ to 20 mg/cm$^2$ (solid content).

Pre-Carbon Film Forming Step

A pre-carbon film forming step is a step of forming a pre-carbon film which is a source of the separation active layer 3 on the coating film by a physical vapor deposition method using carbon as a target material. The pre-carbon film is an amorphous carbon film that has not been compressed (not organized) in the organization step described below.

The pre-carbon film is formed in a stacked manner on the coating film of the porous support substrate 2 using a physical vapor deposition method using carbon as a target material. Examples of the physical vapor deposition method include a high power impulse magnetron sputtering (HiPIMS) method as described below.

The carbon used as a target material is not particularly limited as long as the object of the present invention is not impaired, and the carbon is preferably high purity graphite, and is particularly preferably graphite having a purity of 5 N or higher (purity of 99.999% or higher).

In the pre-carbon film forming step, the physical vapor deposition method such as HiPIMS for forming a pre-carbon film is performed under an atmosphere containing noble gas. Furthermore, as necessary, the method is performed under an atmosphere containing nitrogen gas together with the noble gas.

Examples of the noble gas include argon (Ar), neon (Ne), krypton (Kr), and xenon (Xe).

The nitrogen gas may be used together with a noble gas such as argon when forming a pre-carbon film. Note that, the nitrogen gas is preferably used in combination from the viewpoint of high desalination performance and high water permeability performance of the separation active layer 3 to be finally obtained.

A ratio of the noble gas to the nitrogen gas in the process gas when forming the pre-carbon film is set to, for example, noble gas (Ar):nitrogen gas=1:0.1 to 1:10.

Note that, the thickness of the pre-carbon film is adjusted by appropriately setting the film forming time.

The pre-carbon film is provided with an amorphous carbon structure (DLC structure), and in addition to the carbon atoms (graphite structure) of the sp$^2$ hybridized orbital, carbon atoms of the sp$^3$ hybridized orbital (diamond structure) are present in the pre-carbon film, and the proportion of the carbon atoms of the sp$^3$ hybridized orbital is high. When such a pre-carbon film in an amorphous form is compressed at a high pressure in the organization step described below, the film is densified and organized.

Coating Film Removal Step

A coating film removal step is a step of dissolving and removing the coating film using a predetermined solvent after the pre-carbon film is formed.

After the pre-carbon film is formed on the coating film, from the porous support substrate 2 on which the coating film and the pre-carbon film have been formed, the coating film is dissolved and removed by shaking while using a predetermined solvent.

When the coating film is formed of PVP, for example, an aqueous ethanol solution (volume ratio of ethanol:water=8:2) is used as a solvent for dissolving and removing the coating film.

Note that, in addition to water or alcohols such as ethanol, depending on the type of coating film, a known organic solvent such as ether, ethyl acetate, acetone, or dichloromethane may be used as a solvent for dissolving and removing the coating film. These may be used alone or in combination of two or more of them.

When the coating film is in contact with the predetermined solvent, the coating film is dissolved in the solvent and removed from the porous support substrate 2. As a result, a pre-carbon film is formed in a stacked manner on the porous plastic layer 2B of the porous support substrate 2.

Organization Step

An organization step is a step of compressing the pre-carbon film on the porous support substrate 2 to form a separation active layer formed of a carbon film containing organized carbon on the porous support substrate 2. Examples of a method of compressing the pre-carbon film include a method of organizing the pre-carbon film while compressing by bringing a fluid into contact with the pre-carbon film at a high pressure. The fluid used is not particularly limited as long as the object of the present invention is not impaired, and examples thereof include gases and liquids. In addition, a high pressure may be applied to the pre-carbon film using, for example, a predetermined press machine or the like, without using a fluid, to organize the pre-carbon film.

The organization step is performed using, for example, a filtration device of a cross flow filtration type described below while using a liquid (for example, pure water) capable of penetrating the pre-carbon film as a fluid. The pressure applied to the pre-carbon film is preferably 5.5 MPa or greater. Note that, the upper limit of the applied pressure is not particularly limited as long as the object of the present invention is not impaired, and the upper limit is set to 7 MPa or less for convenience of the filtration device described below.

In addition, the time for applying the high pressure to the pre-carbon film is not particularly limited as long as the object of the present invention is not impaired, and is, for example, 1 hour or longer, preferably 10 hours or longer, and more preferably 20 hours or longer.

In another embodiment, the carbon film containing organized carbon (separation active layer 3) may be formed directly on the porous support substrate 2 by using a physical vapor deposition method or the like, without forming a pre-carbon film.

EXAMPLES

The present invention will be described below in more detail based on Examples. The present invention is not limited to these Examples.

Example 1

Porous Support Substrate

As a porous support substrate, an ultrafiltration membrane (product name "GR40PP", available from Alfa Laval AB) was prepared as a porous support substrate. The porous support substrate is formed of a resin nonwoven backing layer and a porous plastic layer made of polysulfone (PSF) laminated on one surface of the backing layer.

Coating Film Forming Step

The porous support substrate was immersed in a predetermined container containing a coating solution and the porous support substrate was then pulled up from the coating solution. Note that, a polyvinylpyrrolidone (PVP) solution (10% by mass) was prepared as the coating solution. PVP powder (product name: "polyvinylpyrrolidone K30", available from FUJIFILM Wako Pure Chemical Corporation) was used as the PVP in the PVP solution. As a solvent for the PVP solution, a mixed solvent of ethanol and water (ethanol:water=8:2 (volume ratio)) was used.

The porous support substrate with the coating solution attached was then allowed to be left at room temperature for 10 hours to dry the PVP coating (coating film) on the porous support substrate to obtain a porous support substrate with PVP coating.

Pre-Carbon Film Forming Step

A high power impulse magnetron sputtering (HiPIMS) method was utilized to form a pre-carbon film in a stacked manner on the PVP coating of the porous support substrate. The film forming conditions of the pre-carbon film are as follows.

Film forming condition: Example 1
 Film forming device: Batch type carbon film forming device
  Duty ratio: 25%
  Frequency: 1.5 kHz
  Duty cycle: 180 μs
  Process gas (flow rate): Ar (44 sccm), $N_2$ (44 sccm), $CH_4$ (4 sccm)
  Target material: high purity graphite (purity: 99.999%)
  Peak power density: 1.14 $Wcm^{-2}$
  Power density: 0.09 $Wcm^{-2}$
  Film forming pressure: 0.61 Pa
  Film forming time: 825 seconds Film Thickness of Pre-Carbon Film The thickness of the pre-carbon film of Example 1 was measured by a spectroscopic ellipsometer. From the measurement results, the thickness of the pre-carbon film of Example 1 was approximately 30 nm.

Coating Film Removal Step

The porous support substrate on which the pre-carbon film was formed was immersed in an immersion liquid in a predetermined container, and the PVP coating (coating film) was removed while shaking using a digital shaker (available from TAIYO CORPORATION). As the immersion liquid, a mixed solvent of ethanol and pure water (ethanol:water=8:2 (volume ratio)) was used.

Organization Step

The porous support substrate 2 (hereinafter, the pre-reverse osmosis membrane 1P) on which the pre-carbon film was formed was subjected to an organization step using a filtration device of a cross-flow filtration type illustrated in FIG. 2 described below.

In the organization step, the pre-reverse osmosis membrane 1P was set in the filtration device, and the pre-reverse osmosis membrane 1P was compressed for 24 hours under a pressure condition of 5.5 MPa using pure water. Note that the pre-reverse osmosis membrane 1P set in the filtration device has a circular shape with a diameter of 25 mm.

As described above, the separation active layer 3 is obtained by compressing the pre-carbon film and organizing part of the carbon therein using the predetermined filtration device. In this way, the reverse osmosis membrane 1 of Example 1 was obtained.

Water Permeation and Desalination Evaluation

Figure 2:
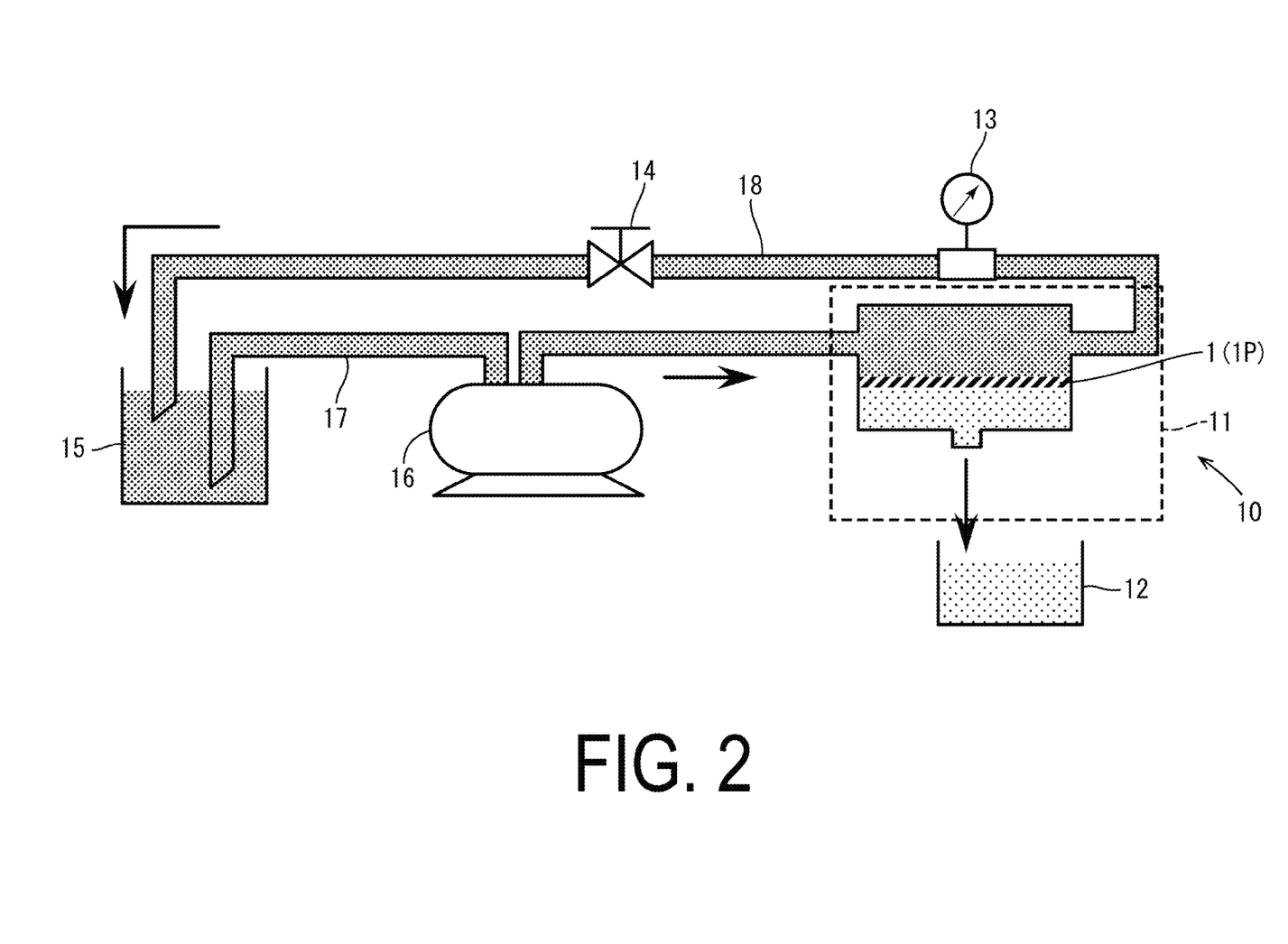
FIG. 2 is a schematic view of a filtration device of a cross flow filtration type.

The reverse osmosis membrane 1 of Example 1 was subjected to a filtration test using the filtration device of the cross-flow filtration type illustrated in FIG. 2. Here, a filtration device 10 will be described with reference to FIG. 2.

FIG. 2 is a schematic view of a filtration device 10 of the cross flow filtration type. The filtration device 10 includes a filtration unit 11, a filtrate collection container 12, a pressure gauge 13, a valve 14, a collection container 15, a pump 16, an upstream pipe 17, and a downstream pipe 18.

The filtration unit 11 is configured to hold a test sample so that a solution to be filtered flows along the surface layer (carbon film) of the test sample (reverse osmosis membrane 1) to be set, and filter the solution to be filtered using the test sample in the middle of the flow. The filtrate collection container 12 is a container for collecting liquid (permeate) that has passed through the test sample.

The solution to be filtered (brine) contained in the collection container 15 is supplied to the filtration unit 11 through the upstream pipe 17. The upstream pipe 17 connects the filtration unit 11 and the collection container 15. In addition, the pump 16 for feeding the solution to be filtered to the filtration unit 11 is set midway on the upstream pipe 17. In addition, the filtration unit 11 and the collection container 15 are connected to each other via the downstream pipe 18, and the solution to be filtered (brine) discharged from the filtration unit 11 passes through the downstream pipe 18 and enters the collection container 15 again. Note that the pressure gauge 13 and the valve 14 are provided midway on the downstream pipe 18, and the flow rate of the solution to be filtered circulating through the downstream pipe 18 and the like is adjusted by opening and closing of the valve 14.

Using this type of filtration device 10, a water permeation and desalination evaluation of the reverse osmosis membrane 1 of Example 1 was performed under the pressure condition of 5.5 MPa while the aqueous sodium chloride solution (concentration: 3.2 wt %) was used as the solution to be filtered.

Figure 3:
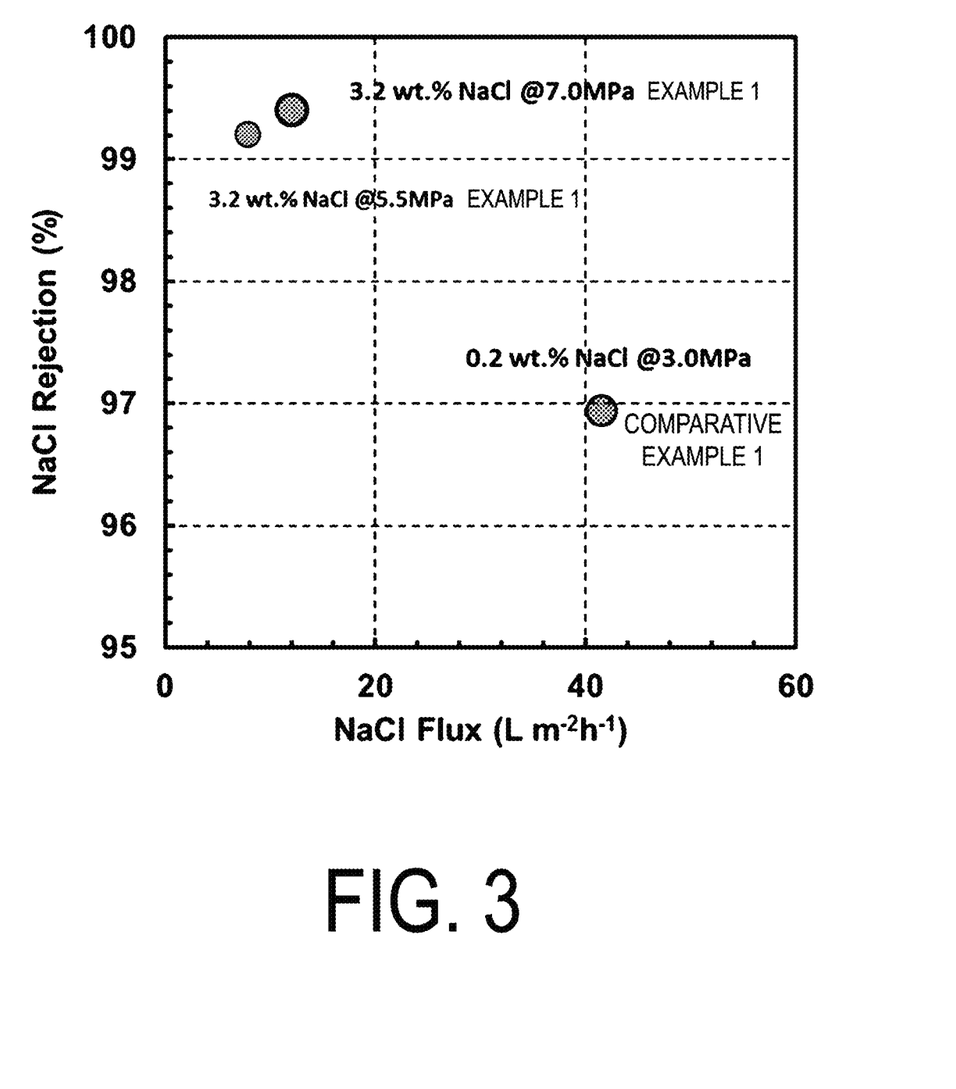
FIG. 3 is a graph illustrating an evaluation result of water permeation and desalination of the membranes of Example 1 and Comparative Example 1.

In the above-described organization step, the pre-reverse osmosis membrane 1P is used as a test sample, and pure water is circulated for 24 hours in the filtration device 10 at a supply pressure of 5.5 MPa. The water permeation and desalination evaluation of the reverse osmosis membrane 1 was continuously performed after the above-described organization step. The evaluation result (5.5 MPa) of water permeation and desalination for the reverse osmosis membrane 1 of Example 1 is illustrated in the graph of FIG. 3.

The water permeation amount (permeation flux) of the test sample is determined by Equation (1) shown below.

$$F = L/ST \qquad (1)$$

In Equation (1) above, F is a permeation flux ($Lm^{-2}h^{-1}$), L is a permeated water amount (L), S is an effective area of the test sample ($m^2$), and T is a test time (h).

In addition, the desalination ratio (%) of the test sample is determined by Equation (2) shown below.

$$R = (1 - C2/C1) \times 100\% \qquad (2)$$

In Equation (2) above, R is the desalination ratio (%), C1 is a NaCl concentration of a stock solution (solution to be filtered) and C2 is a NaCl concentration of the liquid (permeated water) that has passed through the test sample.

Further, the water permeation and desalination ratio evaluation (7.0 MPa) of the reverse osmosis membrane 1 of Example 1 was performed in the same manner as in the case of 5.5 MPa described above except for changing the pressure condition for the reverse osmosis membrane 1 of Example 1 to 7.0 MPa, and the result is illustrated in the graph of FIG. 3.

Comparative Example 1

A pre-reverse osmosis membrane produced in the same manner as in Example 1 (that is, the pre-reverse osmosis membrane with the pre-carbon film in the state where the organization step is not performed) was used as a reverse osmosis membrane of Comparative Example 1. Then, for this reverse osmosis membrane, the water permeation and desalination evaluation was performed by using the filtration device 10 under a pressure condition of 3.0 MPa while an aqueous sodium chloride solution (concentration: 0.2 wt %) was used as the solution to be filtered. The result is illustrated in the graph of FIG. 3.

Regarding Result of Water Permeation and Desalination Evaluation

As illustrated in FIG. 3, in the reverse osmosis membrane 1 of Example 1, when the filtration pressure was 5.5 MPa, the desalination ratio (%) was 99.2%, and the permeation flux ($Lm^{-2}h^{-1}$) was 7.9 $Lm^{-2}h^{-1}$. In addition, for the reverse osmosis membrane 1 of Example 1, when the filtration pressure was 7.0 MPa, the desalination ratio (%) was 99.4%, and the permeation flux ($Lm^{-2}h^{-1}$) was 12.1 $Lm^{-2}h^{-1}$. As described above, it was confirmed that the reverse osmosis membrane 1 of Example 1, which was organized, had excellent desalination performance (separation performance).

Note that in the case of the reverse osmosis membrane of Comparative Example 1 (filtration pressure: 3.0 MPa), the desalination ratio was 96.8%.

Regarding Durability

It was confirmed that the reverse osmosis membrane 1 of Example 1 had stable desalination performance and superior durability even when the water permeation and desalination evaluation described above was performed for a long period of time. It is assumed that this is because the structure was stabilized due to the organization of some of the carbon forming the separation active layer 3 made of the carbon film provided in the reverse osmosis membrane 1.

Analysis by TEM

Preparation of Sample

A pre-reverse osmosis membrane was made in the same manner as in Example 1. The obtained pre-reverse osmosis membrane was set in the filtration device 10 described above and pure water was circulated for 24 hours at a supply pressure of 5.5 MPa to compress and organize the pre-carbon film. The resultant membrane was used as a sample 1.

A pre-reverse osmosis membrane similar to that used in the sample 1 above was prepared. The pre-carbon film was compressed and organized in the same manner as in the sample 1 except that the pure water supply pressure applied to the pre-reverse osmosis membrane was changed to 7.0 MPa. A sample 2 was obtained in this manner.

A pre-reverse osmosis membrane similar to that used in the sample 1 above was prepared to be used as a sample 3.

Figure 4:
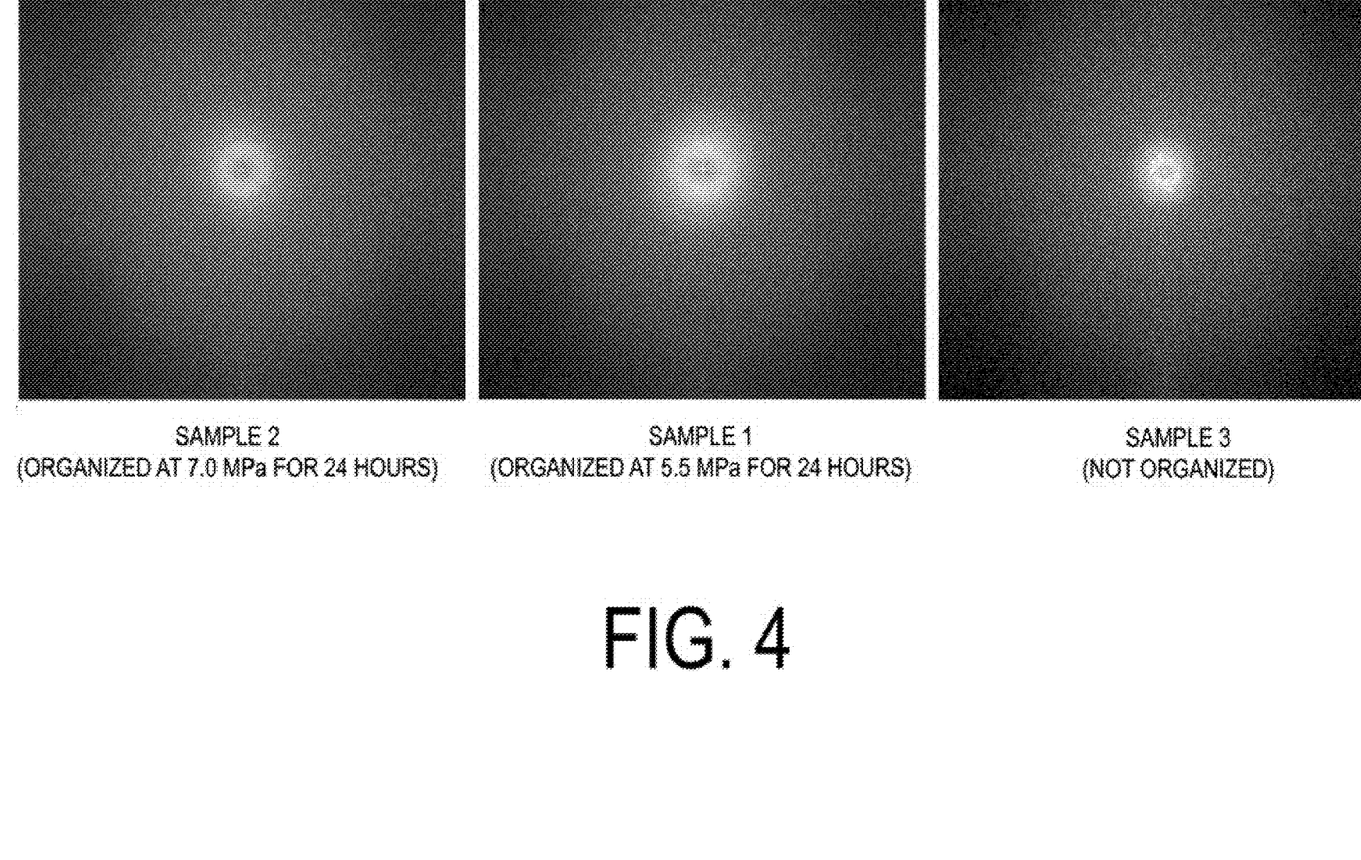
FIG. 4 is a diagram illustrating a diffraction pattern of the membranes of samples 1 to 3 obtained using TEM.
Figure 5:
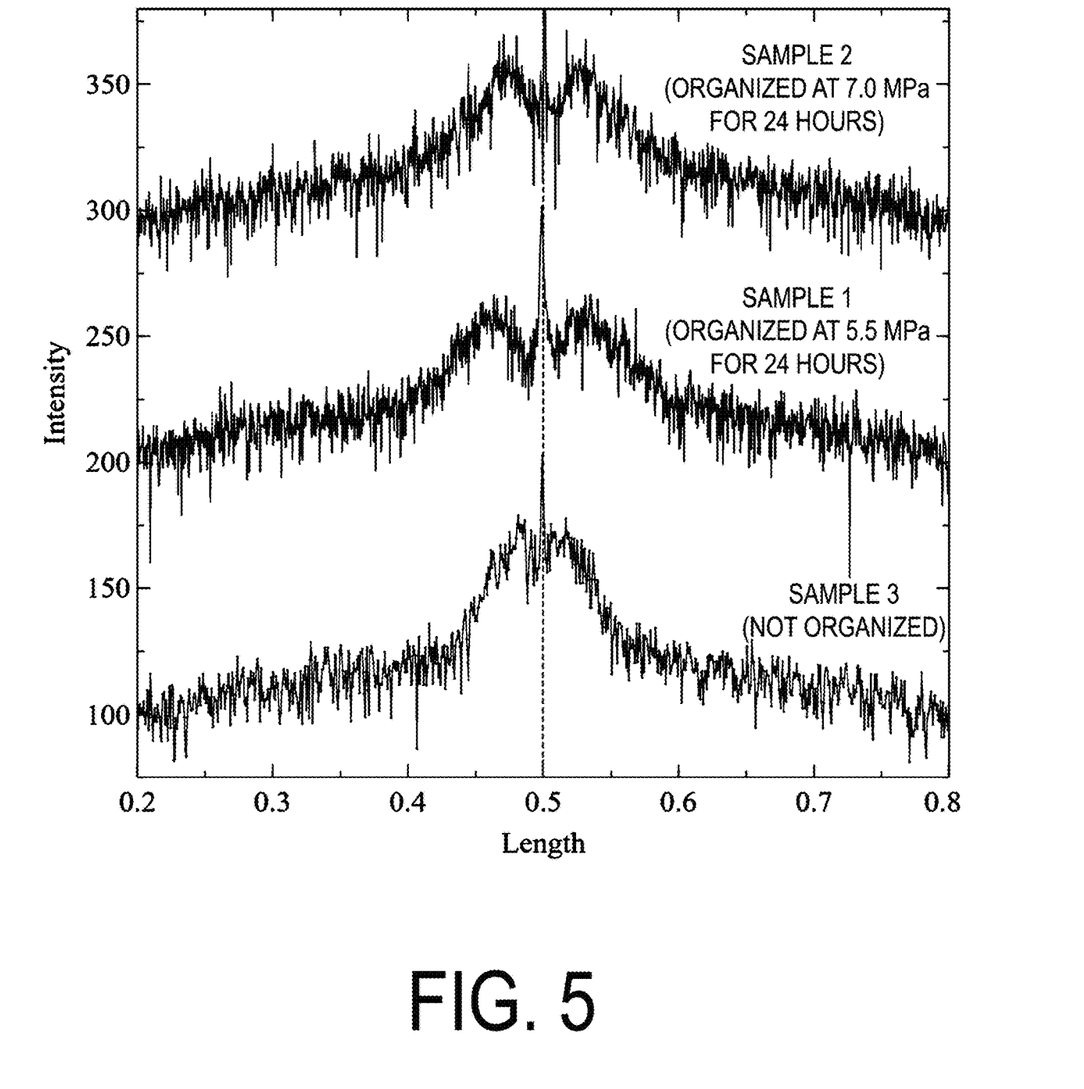
FIG. 5 is a graph in which a relationship between intensity and distance of the diffraction pattern of the membranes of samples 1 to 3 illustrated in FIG. 4 is extracted with a line passing through the center and having an oblique angle of 45°.

Structures of the carbon films of the samples 1 and 2 and a structure of the pre-carbon film of the sample 3 were analyzed using a transmission electron microscope (TEM). The results are illustrated in FIGS. 4 and 5. FIG. 4 is a diagram illustrating a diffraction pattern of each membrane of the samples 1 to 3 obtained using the TEM, and FIG. 5 is a graph in which a relationship between intensity and distance of the diffraction pattern in each membrane of the samples 1 to 3 illustrated in FIG. 4 is extracted with a line passing through the center and having an oblique angle of 45°. Note that a vertical axis in FIG. 5 represents strength and a horizontal axis represents the distance when the total length is 1.

As illustrated in FIG. 5, in the carbon film of the compressed samples 1 and 2, two intensity peaks in a symmetrical relationship were confirmed at positions on both sides of a line (dashed line in FIG. 5) passing through the center of the diffraction pattern. It is assumed that such peaks were generated because the structure of some carbon in the pre-carbon film changed and the carbon was regularly arranged to be organized. In contrast, no such peak was seen in the uncompressed pre-carbon film of the sample 3.

Analysis by Simulation

The change in charge density between the pre-carbon film and the separation active layer (carbon film) obtained from the pre-carbon film was analyzed by simulation. It was confirmed that the separation active layer was organized by, for example, applying pressure to the pre-carbon film, and the charge density of such separation active layer was higher compared to the charge density of the pre-carbon film. Since the separation active layer thus has a high charge density, it is assumed that a substance with a charge to be removed is easily separated. It is also assumed that when the hole structure in the separation active layer or the like changes due to application of pressure and the like, the separation active layer becomes less likely to allow the material to be removed to pass therethrough. For this reason, it is assumed that the reverse osmosis membrane with the separation active layer of an embodiment of the present invention provides permeated water with high desalination ratio.

REFERENCE SIGNS LIST

1 Reverse osmosis membrane
2 Porous support substrate
2A Backing layer
2B Porous plastic layer
3 Separation active layer (carbon film)
10 Filtration device
11 Filtration unit
12 Filtrate collection container
13 Pressure gauge
14 Valve
15 Collection container
16 Pump
17 Upstream pipe
18 Downstream pipe

The invention claimed is:

1. A method for producing a reverse osmosis membrane, the method comprising:
   a coating film forming step of forming a coating film soluble in a predetermined solvent on a surface of a porous support substrate insoluble in the solvent;
   a pre-carbon film forming step of forming a pre-carbon film on the coating film by a physical vapor deposition method using carbon as a target material under an atmosphere containing nitrogen gas together with a noble gas, wherein a ratio of the noble gas:the nitrogen gas is 1:0.1 to 1:10;
   a coating film removal step of dissolving and removing the coating film with the solvent after the pre-carbon film is formed; and
   an organization step of compressing the pre-carbon film by applying a pressure to the pre-carbon film by using pure water of 5.5 MPa or greater for 20 hours or longer to form a separation active layer formed of a carbon film containing organized carbon.

2. The method according to claim 1, wherein, in the coating film removal step, the coating film is dissolved and removed from a laminate of the porous support substrate, the coating film, and the pre-carbon film while being immersed in the solvent.

3. The method according to claim 2, wherein, in the coating film removal step, the solvent with the laminate immersed therein is shaken.

4. The method according to any one of claim 1, wherein the porous support substrate includes a nonwoven backing layer and a porous plastic layer on a surface of the backing layer, and wherein, in the coating film forming step, the coating film is formed on the porous plastic layer.

5. The method according to any one of claim 2, wherein the porous support substrate includes a nonwoven backing layer and a porous plastic layer on a surface of the backing layer, and wherein, in the coating film forming step, the coating film is formed on the porous plastic layer.

6. The method according to any one of claim 3, wherein the porous support substrate includes a nonwoven backing layer and a porous plastic layer on a surface of the backing layer, and wherein, in the coating film forming step, the coating film is formed on the porous plastic layer.

\* \* \* \* \*